(12) United States Patent
Tran et al.

(10) Patent No.: US 9,704,809 B2
(45) Date of Patent: Jul. 11, 2017

(54) FAN-OUT AND HETEROGENEOUS PACKAGING OF ELECTRONIC COMPONENTS

(71) Applicant: Maxim Integrated Products, Inc., San Jose, CA (US)

(72) Inventors: Khanh Tran, Milpitas, CA (US); Arkadii V. Samoilov, Saratoga, CA (US); Pirooz Parvarandeh, Los Altos Hills, CA (US); Amit S. Kelkar, Flower Mound, TX (US)

(73) Assignee: Maxim Integrated Products, Inc., San Jose, CA (US)

( * ) Notice: Subject to any disclaimer, the term of this patent is extended or adjusted under 35 U.S.C. 154(b) by 185 days.

(21) Appl. No.: 13/930,141

(22) Filed: Jun. 28, 2013

(65) Prior Publication Data
US 2014/0252655 A1 Sep. 11, 2014

Related U.S. Application Data

(60) Provisional application No. 61/772,579, filed on Mar. 5, 2013.

(51) Int. Cl.
*H01L 23/538* (2006.01)
*H01L 23/13* (2006.01)
*H01L 23/14* (2006.01)
*H01L 21/48* (2006.01)

(52) U.S. Cl.
CPC ...... *H01L 23/5389* (2013.01); *H01L 21/4803* (2013.01); *H01L 23/13* (2013.01); *H01L 23/147* (2013.01); *H01L 2224/0401* (2013.01); *H01L 2224/04105* (2013.01); *H01L 2224/12105* (2013.01); *H01L 2224/24137* (2013.01); *H01L 2224/32225* (2013.01);
(Continued)

(58) Field of Classification Search
CPC .... H01L 23/5389; H01L 23/13; H01L 23/147
See application file for complete search history.

(56) References Cited

U.S. PATENT DOCUMENTS 3,728,469 A * 4/1973 Rybarczk ................ H01L 23/13
174/546
5,157,479 A * 10/1992 Sekiguchi ............. H01L 23/147
257/628
(Continued)

*Primary Examiner* — Victoria K Hall
(74) *Attorney, Agent, or Firm* — Advent, LLP

(57) ABSTRACT

Aspects of the disclosure pertain to a packaging structure configured for providing heterogeneous packaging of electronic components and a process for making same. The packaging structure includes a carrier substrate having a plurality of cavities formed therein. The packaging structure further includes a first die and a second die. The first die is at least substantially contained within a first cavity included in the plurality of cavities. The second die is at least substantially contained within a second cavity included in the plurality of cavities. The first die is fabricated via a first fabrication technology, and the second die is fabricated via a second fabrication technology, the second fabrication technology being different than the first fabrication technology. The packaging structure also includes electrical interconnect circuitry connected to (e.g., for electrically connecting) the first die, the second die and/or the carrier substrate.

12 Claims, 6 Drawing Sheets

(52) U.S. Cl.
CPC ............... *H01L 2224/73267* (2013.01); *H01L 2224/92244* (2013.01); *H01L 2924/15156* (2013.01)

(56) References Cited

U.S. PATENT DOCUMENTS

| | | | | |
|---|---|---|---|---|
| 5,315,486 A * | 5/1994 | Fillion | ................... | H01L 23/057 174/253 |
| 5,565,706 A * | 10/1996 | Miura et al. | ................... | 257/723 |
| 5,909,052 A * | 6/1999 | Ohta | ................... | G06F 9/3877 257/619 |
| 6,204,555 B1 * | 3/2001 | Iovdalsky | ............... | H01L 23/13 257/622 |
| 6,268,648 B1 * | 7/2001 | Fukutomi | ........... | H01L 21/4803 257/678 |
| 6,340,842 B1 * | 1/2002 | Nakamura | ............ | H01L 23/057 257/678 |
| 6,492,203 B1 * | 12/2002 | Wakashima | ........ | H01L 21/4803 257/E23.004 |
| 6,617,193 B1 * | 9/2003 | Toshio | ............ | H01L 21/4803 257/678 |
| 6,888,222 B2 * | 5/2005 | Shizuno | .............. | H01L 23/3128 257/618 |
| 7,053,644 B1 * | 5/2006 | Lindsey | ............. | G01R 31/2863 324/750.05 |
| 7,413,975 B2 * | 8/2008 | Otsuki | ................ | H01L 21/4857 257/676 |
| 8,349,653 B2 * | 1/2013 | Parvarandeh | .................. | 438/109 |
| 8,906,720 B1 * | 12/2014 | Parvarandeh et al. | .......... | 438/31 |
| 9,324,687 B1 * | 4/2016 | Kelkar | .................... | H01L 25/50 |
| 9,343,426 B1 * | 5/2016 | Parvarandeh | ............. | H01L 24/95 |
| 9,443,815 B2 * | 9/2016 | Liu | ........................ | H01L 24/26 |
| 2006/0286689 A1 * | 12/2006 | Watase | .................... | H01L 22/14 438/5 |
| 2009/0202752 A1 * | 8/2009 | Takahashi | ................. | C09J 7/00 428/1.53 |
| 2010/0213599 A1 * | 8/2010 | Watanabe | ............... | H01L 23/13 257/693 |
| 2011/0300668 A1 * | 12/2011 | Parvarandeh | ........... | H01L 24/95 438/107 |
| 2014/0084391 A1 * | 3/2014 | Lenive | ................ | H01L 23/5389 257/414 |
| 2014/0231635 A1 * | 8/2014 | Kerness et al. | ................ | 250/226 |
| 2015/0049498 A1 * | 2/2015 | Zhou | ............................ | 362/382 |

\* cited by examiner

FAN-OUT AND HETEROGENEOUS PACKAGING OF ELECTRONIC COMPONENTS

CROSS-REFERENCE TO RELATED APPLICATIONS

This application claims priority to U.S. Provisional Application No. 61/772,579 filed on Mar. 5, 2013, entitled: "Fan-out and Heterogeneous Packaging of Electronic Components", which is hereby incorporated by reference in its entirety.

BACKGROUND

In order to provide enhanced levels of connectivity, as well as increased power distribution and signal processing options, semiconductor chips are often mated and affixed to chip carrier substrates. Chip carrier substrates typically include additional conductor layers and separating dielectric layers beyond those included within a semiconductor chip. Thus, chip carrier substrates provide enhanced levels of connectivity of a semiconductor chip to a further assembled higher-level electrical component in functionality and/or performance. While chip carrier substrates are thus essential in providing enhanced performance to microelectronic circuits, chip carrier substrates are nonetheless not entirely without problems.

SUMMARY

A packaging structure configured for providing heterogeneous packaging of electronic components and a process for making same is described herein. The packaging structure includes a carrier substrate having a plurality of cavities formed therein. The cavities are bound by sidewalls and a bottom wall. The sidewalls include sloped portions (e.g., are sloped, are trapezoidal-shaped). The packaging structure further includes a first die and a second die. The first die is at least substantially contained within a first cavity included in the plurality of cavities. The second die is at least substantially contained within a second cavity included in the plurality of cavities. The first die is fabricated via a first fabrication technology, and the second die is fabricated via a second fabrication technology, the second fabrication technology being different than the first fabrication technology. The packaging structure also includes electrical interconnect circuitry connected to the first die, the second die and the carrier substrate.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

A number of currently available systems or structures for packaging integrated devices exist. For example, in order to provide enhanced levels of connectivity (e.g., to a further assembled higher level electrical component), as well as increased power distribution and signal processing options, semiconductor chips are often mated and affixed to chip carrier substrates. There are numerous drawbacks to these currently available products, the most significant of which is the large form-factor typical of multi-chip modules (MCMs).

Described herein is a packaging structure and a method for producing the packaging structure which obviates at least some of the above-referenced drawbacks associated with the currently available packaging structures.

Example Fabrication Processes and Implementations

Figure 1A:
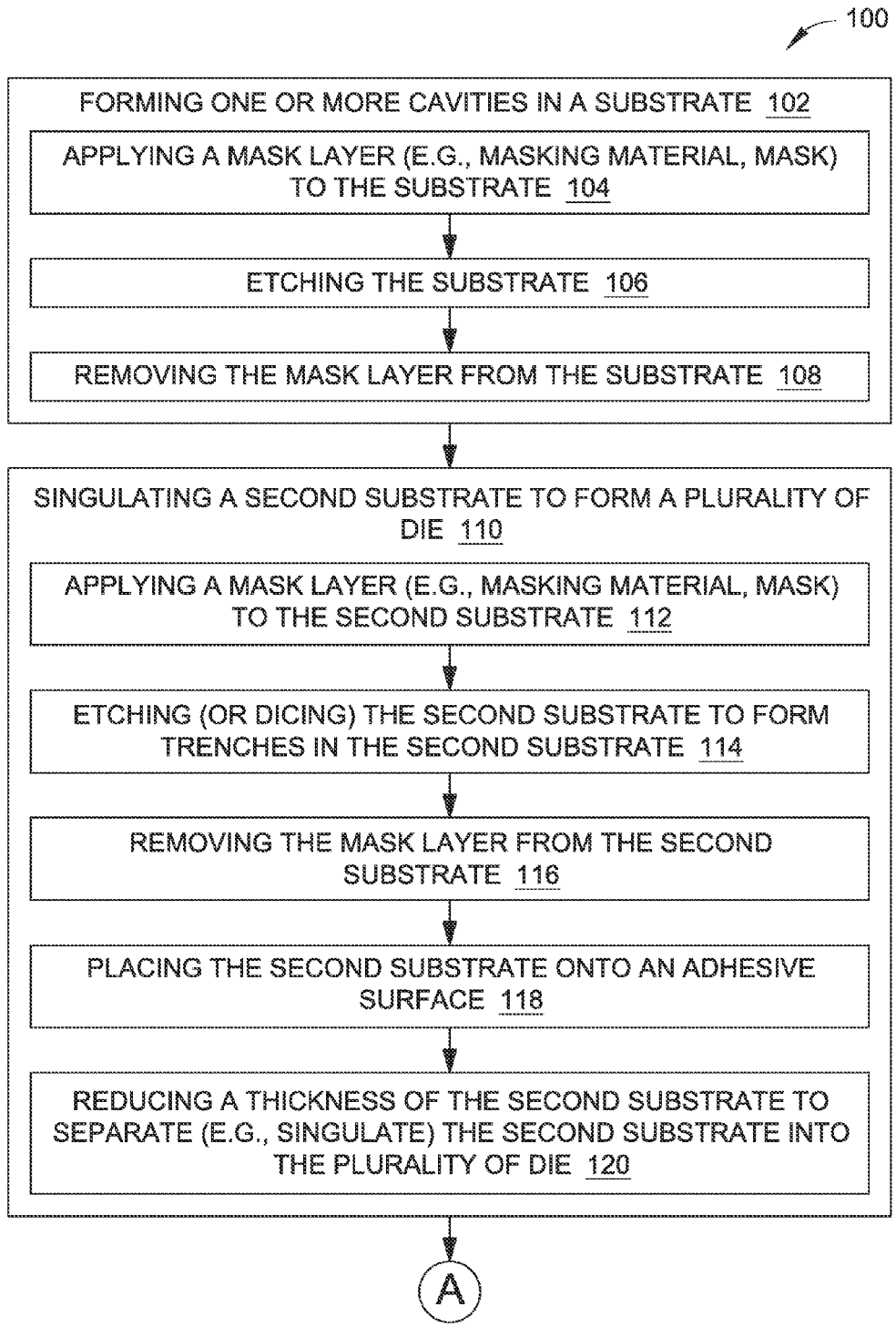
FIGS. 1A and 1B depict a flow diagram illustrating an example process for fabricating a packaging structure in accordance with an exemplary embodiment of the present disclosure.
Figure 1B:
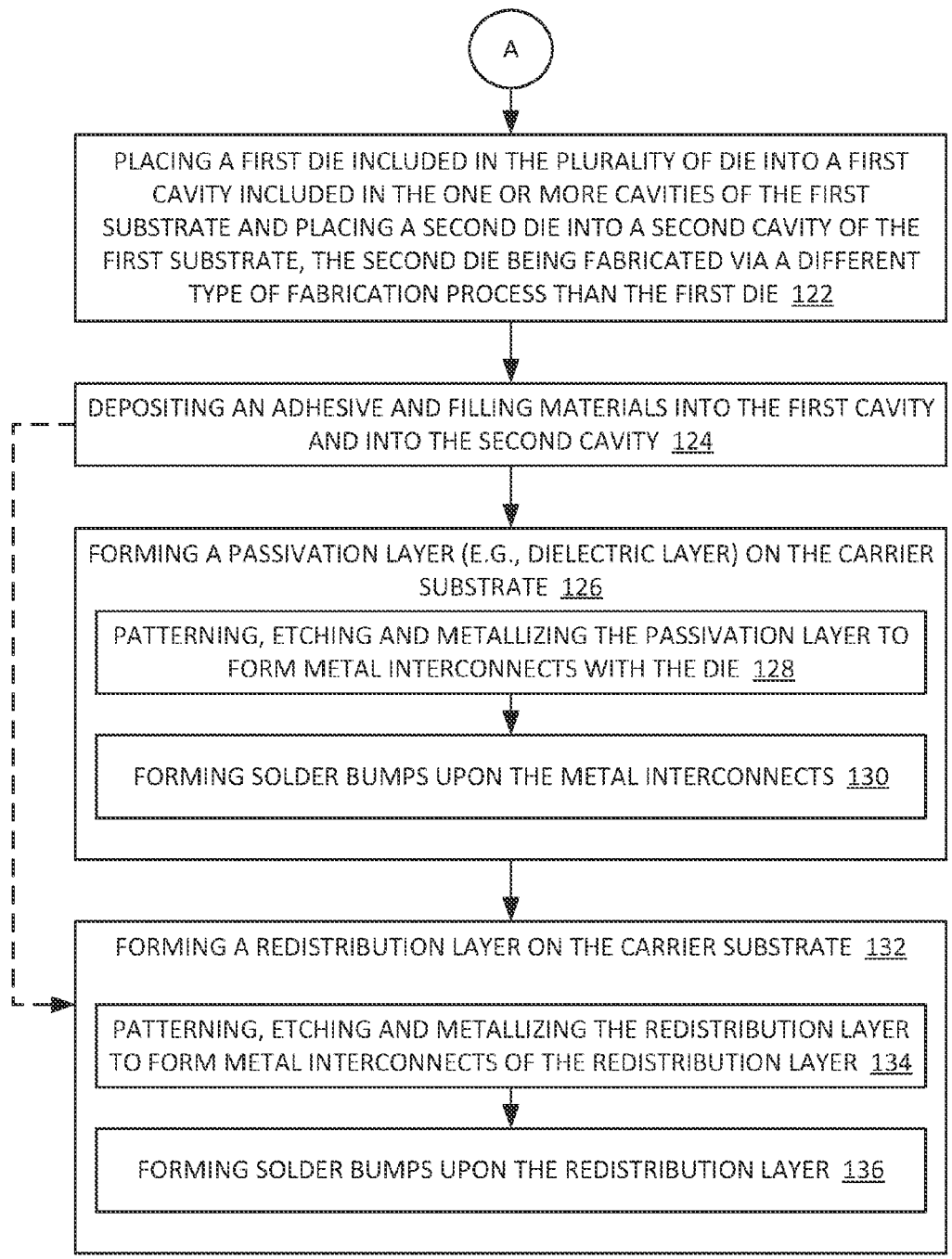
Figure 2:
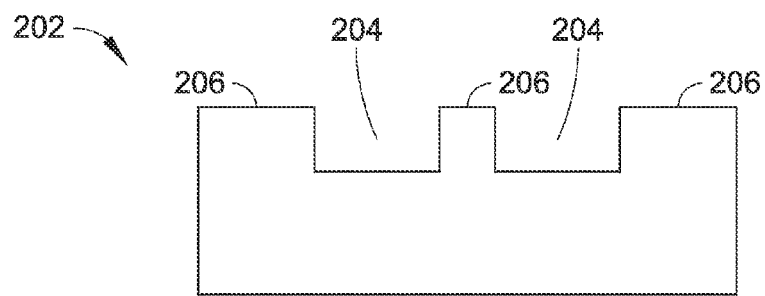
FIG. 2 is a cross-sectional view of a substrate having a plurality of cavities formed in its top surface in accordance with an exemplary embodiment of the present disclosure.

FIGS. 1A and 1B depict a flowchart illustrating an example process or method for fabricating a packaging structure in accordance with an exemplary embodiment of the present disclosure. In embodiments, the method 100 includes the step of forming one or more cavities in a substrate (Step 102). FIG. 2 depicts the substrate 202 after having the one or more cavities 204 formed in its top surface 206 in accordance with an exemplary embodiment of the present disclosure. In embodiments, the substrate 202 is a carrier substrate (e.g., chip carrier substrate). For example, the carrier substrate is formed of semiconductor material. In embodiments, the carrier substrate 202 is a wafer (e.g., a carrier wafer). For example, the carrier substrate 202 is a silicon wafer. In embodiments, the substrate 202 is an interposer (e.g., an interposer wafer) and/or a package.

Figure 3:
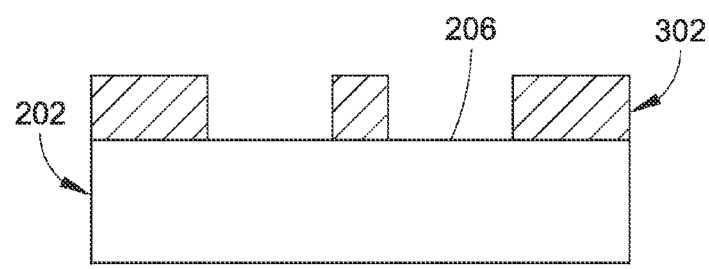
FIG. 3 is a cross-sectional view of the substrate shown in FIG. 2, prior to having the plurality of cavities being formed in its top surface, the substrate having a mask layer applied to it in accordance with an exemplary embodiment of the present disclosure.

In embodiments, the step of forming the cavities in the substrate (Step 102) includes a sub-step of applying a mask layer (e.g., masking material, mask) to the substrate (Step 104). FIG. 3 depicts the substrate 202, prior to the one or more cavities 204 being formed in its top surface 206, having the mask layer 302 applied to it. In embodiments, the mask layer 302 (shown in FIG. 3) is a photoresist which has been patterned using photolithography. In other embodiments, the mask layer 302 is a hard mask (e.g., formed of silicon nitride or silicon oxide). In embodiments, the step of forming cavities in the substrate (Step 102) includes a further sub-step of etching the substrate (Step 106). In embodiments, standard etching processes are implemented. For example, the cavities 204 can be etched into the substrate 202 using a wet etching process (implementing a wet etchant, such as potassium hydroxide), a dry etching (e.g., plasma etching) process, such as deep reactive ion etching (DRIE), or a combination of both. In embodiments, the number and positions of the cavities 204 are formed according to a specified pattern across the top surface 206 of the substrate 202. In embodiments, the step of forming the cavities in the substrate (Step 102) includes a further sub-step of removing the mask layer from the substrate (Step 108). After etching and removal of the mask layer, the result is the carrier substrate 202 having the etched cavities 204, as shown in FIG. 2.

Figure 4:
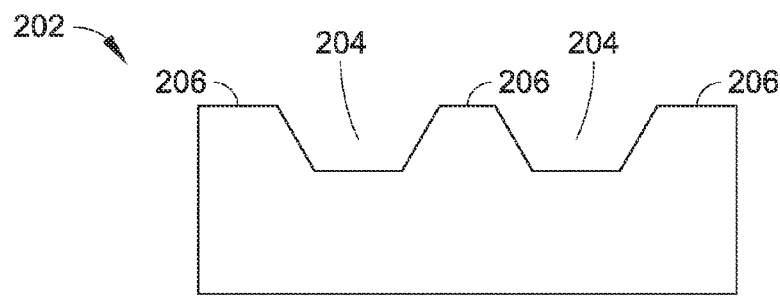
FIG. 4 is a cross-sectional view of a substrate having trapezoidal-shaped cavities in accordance with an exemplary embodiment of the present disclosure.
Figure 5:
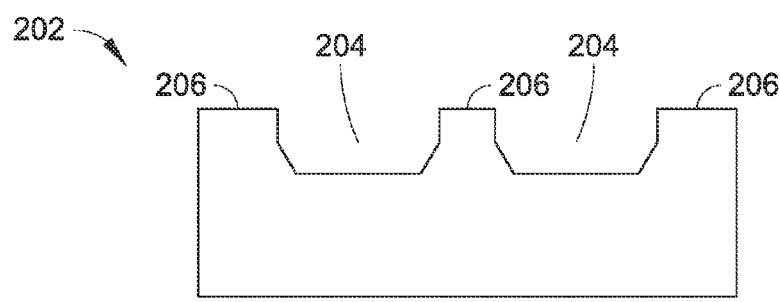
FIG. 5 is a cross-sectional view of a substrate having cavities bound by sidewalls having both a sloped portion and a straight portion, in accordance with an exemplary embodiment of the present disclosure.

In embodiments, one or more of the cavities 204 formed in the substrate 202 are rectangular-shaped, each rectangular-shaped cavity being bounded by straight (e.g., non-sloped) side walls and a bottom wall, as shown in FIG. 2. In embodiments, dry etching is well-suited for forming the rectangular-shaped cavities shown in FIG. 2. In other embodiments, one or more of the cavities 204 formed in the substrate 202 is/are trapezoidal-shaped, each trapezoidal-shaped cavity being bounded by sloped side walls and a bottom wall, as shown in FIG. 4. Further, each of the trapezoidal-shaped cavities taper inward as they extend away from the top surface 206 of the substrate 202. In embodiments, wet etching is well-suited for forming the trapezoidal-shaped cavities shown in FIG. 4. In further embodiments, one or more of the cavities 204 formed in the substrate 202 are each bound by a bottom wall and side walls, the side walls having both a straight portion and a sloped portion, as shown in FIG. 5. In embodiments, a combination of wet etching (e.g., potassium hydroxide etching) and dry/plasma etching (e.g., deep reactive ion etching) is well-suited for forming the cavities shown in FIG. 5.

Figure 6:
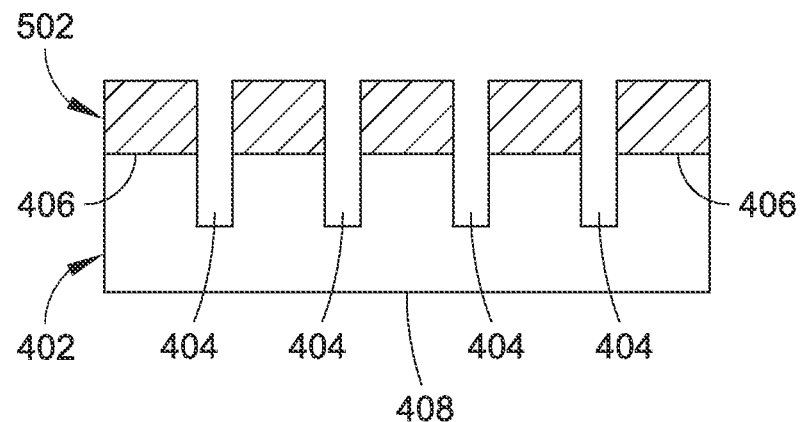
FIG. 6 is a cross-sectional view of a second substrate, the second substrate having a mask layer applied to it, the second substrate further having trenches etched into it in accordance with an exemplary embodiment of the present disclosure.

In embodiments, the method 100 further includes the step of separating (e.g., singulating) a second substrate to form a plurality of die (Step 110). FIG. 6 depicts the second substrate 402. In embodiments, the second substrate 402 is formed of semiconductor material. In embodiments, the second substrate is a wafer (e.g., an active wafer). In embodiments, the second substrate 402 is formed of a same material (e.g., silicon) as the carrier substrate 202. In other embodiments, the second substrate 402 is formed of a different material than the carrier substrate 202. In embodiments, the step of singulating the second substrate to form a plurality of die (Step 110) includes a sub-step of applying a mask layer (e.g., masking material, mask) to the second substrate (Step 112). In embodiments, the mask layer 502 (shown in FIG. 6 applied over the second substrate 402) is a photoresist which has been patterned using photolithography. In other embodiments, the mask layer 502 is a hard mask (e.g., formed of silicon nitride). In embodiments, the step of singulating the second substrate to form the plurality of die (Step 110) further includes a sub-step of etching or dicing the second substrate to form trenches in the second substrate (Step 114). In embodiments, standard etching processes are implemented for forming the trenches 404. For example, the trenches 404 can be etched into a top surface 406 of the second substrate 402 using a dry etching process. In embodiments, the trenches 404 form demarcation lines (e.g., boundaries) between the die. Using a dry etching process to form the trenches 404 in the second substrate 402 allows for precise control of the die dimensions. In embodiments, the trenches 404 extend vertically through the top surface of the second substrate 402 and towards, but not all the way to (e.g., not through) the bottom surface 408. In embodiments, the step of singulating the second substrate to form the plurality of die (Step 110) further includes a sub-step of removing the mask layer from the second substrate (Step 116). In embodiments, as a process simplification where reduced precision of the die dimensions can be tolerated, trenches 404 can be produced by mechanical dicing of the second substrate 402. With this approach, masking and etching steps would be obviated. In a similar manner as above, trenches 404 by partial dicing would extend vertically through the top surface of the second substrate 402 and towards, but not all the way to (e.g., not through) the bottom surface 408.

Figure 7:
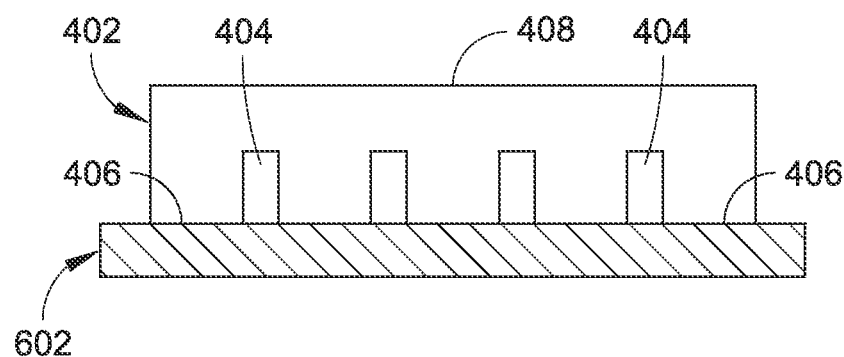
FIG. 7 is a cross-sectional view of the second substrate shown in FIG. 6 after having the mask layer removed and after being inverted, the second substrate is shown as being positioned face-down on a strip of adhesive tape in accordance with an exemplary embodiment of the present disclosure.

In embodiments, the step of singulating the second substrate to form the plurality of die further includes a sub-step of placing the second substrate onto an adhesive surface (Step 118). For example, as shown in FIG. 7, the second substrate 402 is placed onto (e.g., adhered to) an adhesive side of a strip of tape via a pick-and-place mechanism (e.g., via implementation of robotic machines). In embodiments, the second substrate is placed face-down on the tape 602, such that the surface having the trenches 404 formed in it (e.g., the top surface 406) is in direct physical contact with (e.g., adhered to) the tape 602. In embodiments, the step of singulating the second substrate to form the plurality of die further includes reducing a thickness of the second substrate to separate (e.g., singulate) the second substrate into the plurality of die (Step 120). In embodiments, standard wafer backgrinding processes are implemented for reducing the thickness of the second substrate 402. In embodiments, a backgrinding process is applied to the bottom (e.g., back) surface 408 of the second substrate 402 for promoting separation (e.g., singulation) of the second substrate into the individual die (e.g., singulated die). The above sequence in these embodiments for die singulation is what is commonly known as Dice-Before-Grind.

In embodiments, the step of singulating the second substrate to form the plurality of die may be performed without first forming partial trenches that are shown in FIG. 6. Instead, the singulation of the second substrate would include a first sub-step of placing the active side of the second substrate onto an adhesive surface, a second sub-step of grinding the backside side of the second substrate to achieve a desired thickness of the second substrate, a third sub-step of removing the active circuitry (i.e., front) side adhesive and applying a backside adhesive, and a fourth sub-step of dicing through the entire thickness of the second substrate to achieve the plurality of die (e.g., singulated die, integrated circuits, chips, integrated devices).

Figure 8:
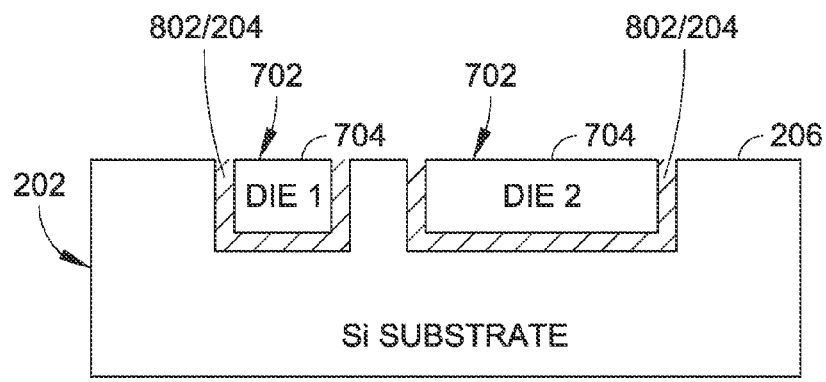
FIG. 8 is a cross-sectional view of a substrate having rectangular-shaped cavities, the cavities containing singulated die in accordance with an exemplary embodiment of the present disclosure.
Figure 9:
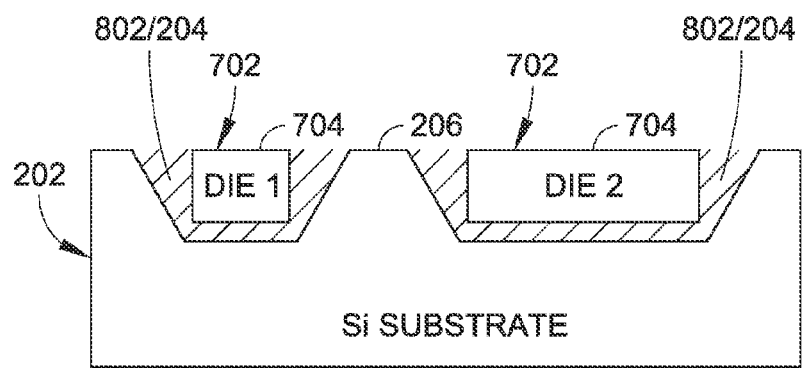
FIG. 9 is a cross-sectional view of a substrate having trapezoidal-shaped cavities, the cavities containing singulated die in accordance with an exemplary embodiment of the present disclosure.
Figure 10:
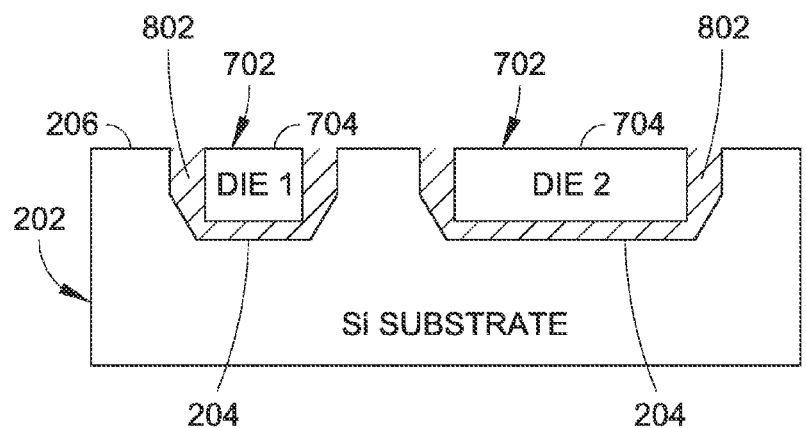
FIG. 10 is a cross-sectional view of a substrate having cavities bound by sidewalls having both a sloped portion and a straight portion, the cavities containing singulated die in accordance with an exemplary embodiment of the present disclosure.

In embodiments, the method 100 further includes the step of placing a first die included in the plurality of die into a first cavity included in the one or more cavities of the first substrate and placing a second die into a second cavity included in the one or more cavities of the first substrate, the second die being of the same or different circuit design that the first die, or fabricated via a same or a different type of fabrication process (e.g., fabrication technology) as/than the first die (Step 122). In embodiments, the first die is separated (e.g., removed) from the tape 602 and is placed into the first cavity 204 of the first substrate 202, the second die is separated (e.g., removed) from the tape 602 and is placed into the second cavity 204 of the first substrate 202. In embodiments, the first and second die are removed from the tape 602 and/or placed into their respective cavities 204 via a standard pick-and-place process, a self-aligning pick-and-place process, an agitation assembly process, a fluidic self-assembly process, or the like. In embodiments, as shown in FIG. 8, FIG. 9, and FIG. 10, the die 702 are generally rectangular-shaped and each of the cavities 204 are sized and shaped for receiving the die 702 within the cavities 204. In embodiments, active circuitry of each die 702 is located on a top surface 704 of the die 702. In embodiments in which the cavities 204 are rectangular-shaped, as shown in FIG. 8, the cavities 204 are well-suited for receiving the rectangular-shaped die with minimal lateral dimensions for the cavities. In embodiments in which the cavities 204 are trapezoidal-shaped, as shown in FIG. 9, the sloped side walls bounding the trapezoidal-shaped cavities provide an alignment feature, such that they promote ease of alignment (e.g., precise alignment, self-alignment) of the die 702 relative to the first substrate 202 when the die are placed (e.g., embedded) within these cavities. In embodiments in which the cavities 204 are bounded by both side walls having both a straight portion and a sloped portion, as shown in FIG. 10, these cavities combine the benefits of each of the cavity types shown in FIGS. 8 and 9. For example, the sloped portions of the side walls allow the cavities 204 shown in FIG. 10 to provide the self-alignment characteristics of the trapezoidal-shaped cavities, while the straight portions of the side walls allow the cavities 204 shown in FIG. 10 to have reduced lateral size compared to the trapezoidal-shaped cavities.

In embodiments, the method 100 further includes the step of depositing an adhesive and filling materials into the first cavity and into second cavity (Step 124) (e.g., gap filling). In embodiments, the adhesive and filling materials may be deposited in two steps to cover the bottom and dies separately, or combined in a single step. In embodiments, as shown in FIGS. 8-10, the filling material 802 (e.g., gap filling material) is placed around the die 702 (e.g., around the sides and/or bottom of the die) for eliminating gaps between the die 702 and the walls (e.g., side walls and/or bottom wall) bounding the cavities 204. In embodiments, the filling material 802 is an epoxy resin. In embodiments, such as shown in FIGS. 9 and 10, the sloped side walls and/or sloped portions of the side walls bounding these cavities 204 promotes robust gap filling. In some embodiments, prior to placing the die 702 within the cavities 204, a local adhesive (e.g., glue, a light adhesive) can be applied between the die 702 and the walls (e.g., bottom walls) bounding the cavities 204 for promoting securing of the die 702 within the cavities. Both conductive or non-conductive adhesives can be used depending on a prescribed need for the die backside to be electrically floating or tied to the host substrate. Additionally both wet (i.e., liquid dispensed) or dry (i.e., film) adhesive may be employed depending on suitable characteristics for thermal and mechanical compatibility with surrounding material and process compatibility with previous and subsequent processing steps. Further, in embodiments such as shown in FIGS. 9 and 10, having the rectangular-shaped die 702 embedded in cavities 204 having sloped side walls de-couples gluing from side gap filling, thereby promoting flexible, robust implementation. In embodiments, by optimizing the die thickness, glue thickness under the die, and cavity depth, the die 702 are oriented (e.g., positioned) within the cavities 204 such that the top surfaces 704 of the die 702 are generally co-planar with the top surface 206 of the carrier substrate 202 to facilitate subsequent interconnect routing over and between embedded dies.

Figure 11:
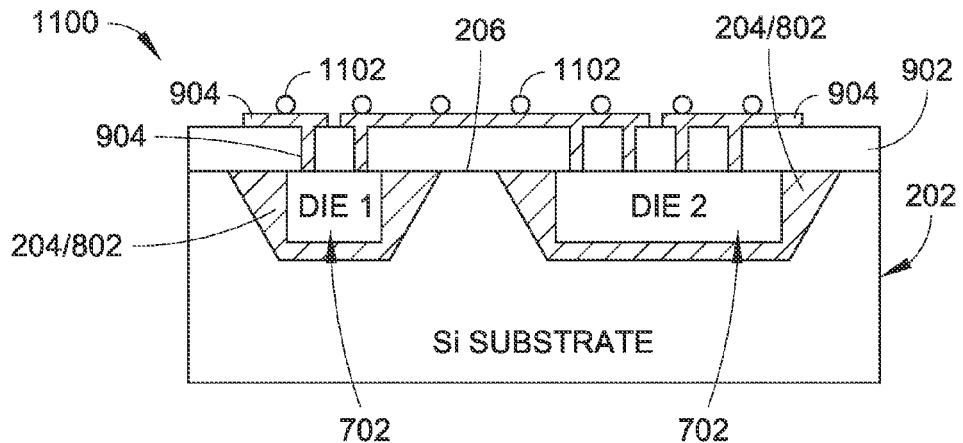
FIG. 11 is a cross-sectional view of a packaging structure in accordance with an exemplary embodiment of the present disclosure.
Figure 12:
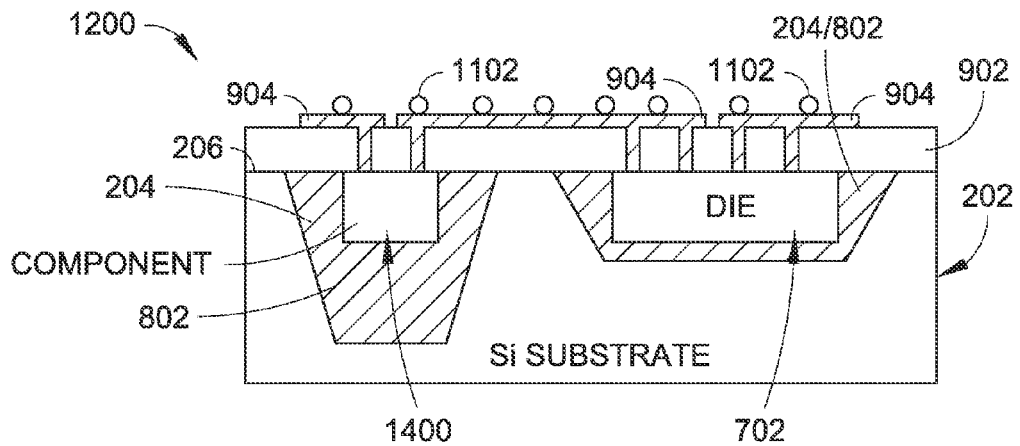
FIG. 12 is a cross-sectional view of a packaging structure containing a component in its first cavity and containing a die in its second cavity in accordance with a further exemplary embodiment of the present disclosure.

In embodiments, the method 100 further includes the step of forming a passivation layer (e.g., dielectric layer with conformal or planarized surface) on the carrier substrate (Step 126). FIG. 11, and FIG. 12 each show the passivation layer 902 formed upon the top surface 206 of the substrate 202 in accordance with embodiments of the present disclosure. In embodiments, the passivation layer 902 is also formed over the cavities 204 and upon the top surfaces 704 of the die 702. In embodiments, the method 100 further includes the step of patterning, etching the passivation layer to create openings (i.e., vias) to the top-level metal of the embedded die, and metallizing within the vias and upon the passivation layer to form metal interconnects (e.g., metal lines, wiring, high density vertical and/or lateral metal interconnects) within the die, from die to substrate, (Step 128) and from die to die. FIGS. 11 and 12 illustrate the metal interconnects 904 of the passivation layer 902. In embodiments, the metal interconnects 904 are connected to the top surfaces 704 of the die 702. Further, the metal interconnects 904 electrically connect the die 702 to each other and to the carrier substrate 202. For example, the metal interconnects 904 provide within-die connectivity and die-to-die connectivity. In embodiments, the method 100 further includes a step of forming solder bumps upon the metal interconnect layer (e.g., metal interconnects) (Step 130). FIGS. 11 and 12 show the solder bumps 1102 upon the metal interconnect layer 904.

Figure 13:
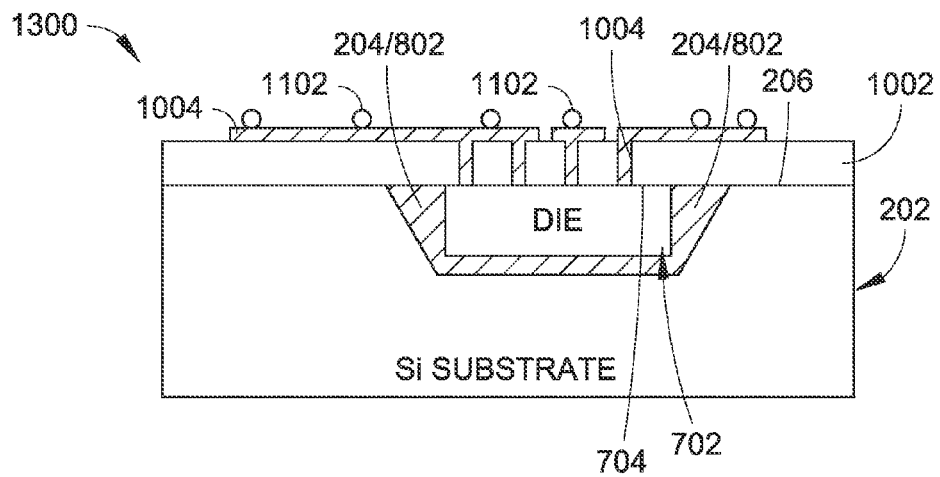
FIG. 13 is a cross-sectional view of a packaging structure including a single die fan-out structure in accordance with a further exemplary embodiment of the present disclosure.

In other embodiments, as an alternative to performing (e.g., including) steps 126, 128 and 130, the method 100 further includes the step of forming a redistribution layer on the carrier substrate (Step 132). FIG. 13 shows an embodiment, in which the substrate 202 includes only a single cavity 204 formed in the top surface 206 of the substrate 202 and one die 702 is positioned within that single cavity 204. In embodiments, the redistribution layer 1004 is formed upon and into the passivation layer 1002 to redistribute (i.e., spread out) the electrical connectivity of die over the larger die plus substrate 202 in accordance with embodiments of the present disclosure. In the embodiment shown in FIG. 13, the redistribution layer 1004 is formed over the single cavity 204 and upon the top surface 704 of the single die 702. In embodiments, the method 100 further includes the step of patterning, etching the passivation layer to create openings (i.e., vias) to the top-level metal of the embedded die, and metallizing within the vias and upon the passivation layer to form metal interconnects of the redistribution layer (Step 134). In embodiments, the redistribution layer 1004 reroutes some or all connections from the area coinciding with the die 702 to the area coinciding with the carrier substrate 202. This configuration is referred to as a fan-out structure. FIG. 13 illustrates a single die fan-out configuration. The input/output (I/O) interface with the die 702 is fanned out from the top surfaces 704 of the die 702 to the top surface 206 of the carrier substrate 202. In the fan-out embodiments, the top surface 206 of the carrier substrate 202 is used to expand the connection area between the carrier substrate 202 and the active circuitry of the die 702. In embodiments, the method 100 further includes a step of forming solder bumps upon the redistribution layer (Step 136). Such redistribution layer may be used to enable larger solder bumps that would not otherwise fit within the original area of the embedded die. FIG. 13 shows the solder bumps 1102 upon the redistribution layer 1004.

In embodiments, the method 100 described above produces the packaging structures (e.g., wafer-level packaging assemblies) 1100, 1200 and 1300 shown in FIGS. 11, 12 and 13 respectively. In embodiments, the packaging structures (1100, 1200, 1300) (e.g., the die 702 of the packaging structures) are configured for being connected (e.g., bonded to) other substrates, devices, or the like, via any one of a number of various bonding methods (e.g., wire bonding, wafer bonding and/or the like), such as described in co-owned U.S. Patent Publication No. 2011/0300668 entitled: "Use of Device Assembly for a Generalization of Three-Dimensional Metal Interconnect Technologies", filed on Jun. 2, 2010, which is herein incorporated by reference in its entirety.

In embodiments, as shown in FIG. 12, one or more components 1400 can be substituted for one or more of the die 702 in the packaging structure 1200. In embodiments, the one or more components 1400 are rectangular-shaped, discrete components (e.g., off-the-shelf discrete components, discrete devices). In embodiments, the die 702 and/or component(s) 1400 can be formed of the same material (e.g., silicon) as the substrate 202. This promotes good coefficient of thermal expansion (CTE)/thermal matching between the die 702 and the substrate 202, or the component(s) 1400 and the substrate 202. In embodiments, when multiple die 702 (e.g., multiple singulated die) are included in the packaging structure, the multiple die 702 can be of the same type. For example, multiple die 702 of the same type are fabricated using the same technology (e.g., complementary metal-oxide-semiconductor (CMOS) technology, Silicon-on-Insulator (SOI) technology, Gallium Arsenide (GaAs) technology, or Gallium Nitride (GaN) technology). In other embodiments, when multiple die 702 are included in the packaging structure, at least two of the multiple die can be of different types, such that they are fabricated using different technologies. In embodiments, when multiple components 1400 are included in the packaging structure, the multiple components can be of the same type (e.g., fabricated using the same technology), or, at least two of the components 1400 can be of different types (e.g., fabricated using different technologies). Thus, in embodiments, the packaging structures (1100, 1200) of the present disclosure allow for heterogeneous integration of a wide variety of integrated and discrete devices (e.g., integration of multiple dies and/or components of different technologies). For example, the packaging structures can implement a combination of digital+analog+memory+passives. Further, in embodiments, the packaging structures of the present disclosure promote higher analog integration (e.g., an ultrasound receiver (high voltage (HV) switches+receiver+analog-to-digital converter (ADC)+Capacitors (Caps)).

In embodiments in which multiple die 702 are implemented (as in FIG. 11) in the packaging structure 1100, the relative sizes and/or shapes of the die 702 can be the same or can differ from one another. In embodiments in which the packaging structure 1200 implements one or more components 1400 in combination with one or more die 702 (as shown in FIG. 12), the size(s) and/or shape(s) of the component(s) 1400 can be the same as or can differ from those of the die 702. In embodiments in which multiple components are implemented, the relative sizes and/or shapes of the components can be the same or can differ. Correspondingly, the cavities 204 of the substrate 202 can be the same size and/or shape or can be different sizes and/or shapes relative to each other for accommodating the die 702 and/or components 1400. For example, as shown in FIGS. 11 and 12, the cavities 204 can be different widths (FIGS. 11, 12) and/or depths (FIG. 12) relative to each other. In embodiments, because the cavities 204 of the packaging structures are sized to accommodate large, rectangular-shaped die, the packaging structures described herein promote reduced processing complexity and cost by reducing or eliminating the need for die shaping prior to the die being placed in the cavities. Further, the packaging structures (1100, 1200, 1300) described herein promote tighter design rules due to wiring using wafer-level processing, which is enabled by the die alignment accuracy provided by the cavities 204 of the packaging structures.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A packaging structure, comprising:
  a chip carrier substrate, the chip carrier substrate having a plurality of cavities formed therein, the cavities being bound by sidewalls and a bottom wall;
  a first die, the first die being at least substantially contained within a first cavity included in the plurality of cavities, the first die being fabricated via a first type of fabrication process;
  a second die, the second die being at least substantially contained within a second cavity included in the plurality of cavities, the second die being fabricated via a second type of fabrication process, the second type of fabrication process being different than the first type of fabrication process;
  an adhesive layer located within each of the first and second cavities, between the bottom wall and a first side of a respective one of the first and second die, the adhesive layer having a thickness that causes a second side of the respective one of the first and second die that is opposite the first side to be substantially coplanar with a surface of the chip carrier substrate;
  filling material, different from the adhesive layer, located within the first and second cavities and around the first die and second die, wherein the sidewalls of the chip carrier substrate include sloped portions forming inner walls of the first and second cavities, wherein the first and second die are rectangular, and wherein the filling material fills gaps between the sloped portions forming the inner walls of the first and second cavities and non-sloped side surfaces of the first and second die;
a passivation layer formed upon the surface of the chip carrier substrate, over the first and second cavities, and over the first and second die, the passivation layer having a plurality of vias that extend from a first side of the passivation layer to a second side of the passivation layer that is opposite the first side of the passivation layer; and
electrical interconnect circuitry connecting the first die, the second die and the chip carrier substrate, wherein the electrical interconnect circuitry is formed by metallizing upon the passivation layer and within the plurality of vias, and wherein the plurality of vias and the electrical interconnect circuitry are configured to provide within-die connectivity for at least one of the first die or the second die and are further configured to provide die-to-die connectivity between the first die and the second die.

2. The packaging structure as claimed in claim 1, wherein the chip carrier substrate is formed of semiconductor material.

3. The packaging structure as claimed in claim 1, wherein the first type of fabrication process and the second type of fabrication process are each one of: complementary metal-oxide-semiconductor (CMOS) technology, Silicon-on-Insulator (SOI) technology, Gallium Arsenide (GaAs) technology, or Gallium Nitride (GaN) technology.

4. The packaging structure as claimed in claim 1, wherein the electrical interconnect circuitry includes a patterned, etched and metallized connectivity layer upon the passivation layer of the chip carrier substrate.

5. The packaging structure as claimed in claim 1, wherein the adhesive layer comprises a light-cured adhesive, and the filling material comprises an epoxy resin.

6. The packaging structure as claimed in claim 1, further comprising a plurality of solder bumps disposed upon electrical interconnect circuitry, the plurality of solder bumps including one or more solder bumps located over at least one of the first die or the second die and one or more solder bumps located over a portion of the surface of the chip carrier substrate.

7. A packaging structure, comprising:
a chip carrier substrate, the chip carrier substrate being formed of semiconductor material and having a plurality of cavities formed therein, the cavities being bound by sloped sidewalls and a bottom wall;
a die, the die being at least substantially contained within a first cavity included in the plurality of cavities, the die being fabricated via a type of fabrication process;
a component, the component being substantially contained within a second cavity included in the plurality of cavities, the component being an off-the-shelf discrete component;
an adhesive layer located within each of the first and second cavities, between the bottom wall and a first side of a respective one of the die and the component, the adhesive layer having a thickness that causes a second side of the respective one of the die and the component that is opposite the first side to be substantially coplanar with a surface of the chip carrier substrate;
filling material, different from the adhesive layer, located within the first and second cavities and around the die and component, wherein the die and the component are rectangular, and wherein the filling material fills gaps between the sloped sidewalls bounding the first and second cavities and non-sloped side surfaces of the die and the component;
a passivation layer formed upon the surface of the chip carrier substrate, over the first and second cavities, and over the die and the component, the passivation layer having a plurality of vias that extend from a first side of the passivation layer to a second side of the passivation layer that is opposite the first side of the passivation layer; and
electrical interconnect circuitry connecting the die, the component and the chip carrier substrate, wherein the electrical interconnect circuitry is formed by metallizing upon the passivation layer and within the plurality of vias, and wherein the plurality of vias and the electrical interconnect circuitry are configured to provide within-die connectivity for the die and are further configured to provide connectivity between the die and the component.

8. The packaging structure as claimed in claim 7, wherein the type of fabrication process is one of: complementary metal-oxide-semiconductor (CMOS) technology, Silicon-on-Insulator (SOI) technology, Gallium Arsenide (GaAs) technology, or Gallium Nitride (GaN) technology.

9. The packaging structure as claimed in claim 7, wherein the filling material is an epoxy resin filling material.

10. The packaging structure as claimed in claim 7, wherein the electrical interconnect circuitry includes a patterned, etched and metallized connectivity layer upon the passivation layer of the chip carrier substrate.

11. A packaging structure, comprising:
a chip carrier substrate, the chip carrier substrate being formed of semiconductor material and having a plurality of cavities formed therein, the cavities being bound by sloped sidewalls and a bottom wall;
a die, the die being at least substantially contained within a cavity included in the plurality of cavities, the die being fabricated via a type of fabrication process;
an adhesive layer located within the cavity, between the bottom wall and a first side of the die, the adhesive layer having a thickness that causes a second side of the die that is opposite the first side to be substantially coplanar with a surface of the chip carrier substrate;
filling material, different from the adhesive layer, being located within the cavity and around the die, wherein the die is rectangular, and wherein the filling material fills gaps between the sloped sidewalls bounding the cavity and non-sloped side surfaces of the die;
a passivation layer formed upon the surface of the chip carrier substrate, over the cavity, and over the die, the passivation layer having a plurality of vias that extend from a first side of the passivation layer to a second side of the passivation layer that is opposite the first side of the passivation layer, wherein the plurality of vias are configured for providing within-die connectivity for the die and die-to-die connectivity between the die and at least a second die; and
electrical redistribution to fanout electrical connections of the die, the electrical redistribution formed by metallizing upon the passivation layer and within the plurality of vias.

12. The packaging structure as claimed in claim 11, wherein the electrical redistribution includes patterned, etched and metallized redistribution interconnects.

* * * * *